United States Patent

Shibata

(10) Patent No.: US 8,841,143 B2
(45) Date of Patent: Sep. 23, 2014

(54) METHOD OF MANUFACTURING OPTICAL MODULATOR

(71) Applicant: Kimitaka Shibata, Tokyo (JP)

(72) Inventor: Kimitaka Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/846,067

(22) Filed: Mar. 18, 2013

(65) Prior Publication Data

US 2014/0087493 A1   Mar. 27, 2014

(30) Foreign Application Priority Data

Sep. 21, 2012 (JP) ................. 2012-208417

(51) Int. Cl.
| | |
|---|---|
| H01L 21/66 | (2006.01) |
| H01S 5/026 | (2006.01) |
| H01S 5/22 | (2006.01) |
| H01S 5/20 | (2006.01) |
| H01S 5/00 | (2006.01) |
| H01S 5/12 | (2006.01) |

(52) U.S. Cl.
CPC ............... *H01S 5/026* (2013.01); *H01S 5/2086* (2013.01); *H01S 5/22* (2013.01); *H01S 5/0265* (2013.01); *H01S 5/0042* (2013.01); *H01S 5/12* (2013.01)
USPC ......................................................... 438/16

(58) Field of Classification Search
CPC ......... H01L 21/00; H01I 21/203; H01I 31/12; H01I 31/072; H01I 21/66
USPC .......... 438/16, 478, 22; 257/94, 106, 80, 615; 385/14
See application file for complete search history.

(56) References Cited

U.S. PATENT DOCUMENTS

| | | | |
|---|---|---|---|
| 5,717,710 A | 2/1998 | Miyazaki et al. | |
| 6,274,398 B1 | 8/2001 | Bendz et al. | |
| 6,399,404 B2 * | 6/2002 | Sakata | 438/22 |
| 2001/0034071 A1 * | 10/2001 | Arakawa et al. | 438/22 |
| 2004/0213515 A1 * | 10/2004 | Pezeshki et al. | 385/31 |
| 2005/0006654 A1 * | 1/2005 | Kang et al. | 257/80 |
| 2006/0054899 A1 * | 3/2006 | Takahashi et al. | 257/80 |
| 2009/0203159 A1 * | 8/2009 | Katsuyama | 438/29 |
| 2013/0012002 A1 * | 1/2013 | Yoneda et al. | 438/478 |

FOREIGN PATENT DOCUMENTS

| | | |
|---|---|---|
| JP | 8-162701 A | 6/1996 |
| JP | 2002-33547 A | 1/2002 |
| JP | 2002-533940 A | 8/2002 |

\* cited by examiner

*Primary Examiner* — Chuong A Luu
*Assistant Examiner* — Sheikh Maruf
(74) *Attorney, Agent, or Firm* — Leydig, Voit & Mayer, Ltd.

(57) ABSTRACT

A method for manufacturing an optical modulator having a laser diode section and an EAM section. LD growth layers which are semiconductor layers for manufacturing the laser diode section, are formed on a semiconductor substrate. An EAM absorption layer for forming the EAM section is then formed on the semiconductor substrate. The photoluminescent wavelength of the EAM absorption layer is then measured. The LD growth layers are then etched to form a stripe structure section. The width of the stripe structure section is determined such that the difference between the lasing wavelength of the LD section and the photoluminescent wavelength of the EAM section is close to a design value.

8 Claims, 8 Drawing Sheets

METHOD OF MANUFACTURING OPTICAL MODULATOR

FIELD OF THE INVENTION

The present invention relates to a method of manufacturing an optical modulator, and to an optical modulator.

BACKGROUND ART

Semiconductor integrated circuits in which a semiconductor laser and an optical modulator are integrated together have been known, as disclosed, e.g., in Published Japanese Translation of PCT Application No. 2002-533940. Paragraph [008] of this publication mentions that the difference in wavelength between photonic devices on a substrate may be dependent on their positions on the substrate, and that the difference in wavelength between a laser and a modulator therefor, called detuning, is important. This publication describes a circuit mask for manufacturing a laser and a modulator on a substrate, said circuit mask including two mask portions (i.e., a laser mask portion and a modulator mask portion), and discloses a method for determining the width of the modulator portion (or modulator mask portion) in order to achieve necessary wavelength compensation.

Other prior art includes Japanese Laid-Open Patent Publication No. 2002-033547.

Optical modulators in which a laser diode section (also referred to hereinafter as an LD section) and an electroabsorption modulator section (also referred to hereinafter as an EAM section) are integrated together are manufactured by forming the LD section and the EAM section on the same substrate. The principal performance of such integrated optical modulators depends on the absorption spectrum of the EAM section, the lasing wavelength of the LD section, and the difference between these wavelengths. It should be noted that the difference between the lasing wavelength of the LD section and the photoluminescent wavelength of the EAM section is preferably as close to the design value as possible (this difference being also referred to hereinafter as $\Delta\lambda$).

However, the lasing wavelength of the LD section varies to a certain extent due to manufacturing variations of the LD section, and the photoluminescent wavelength of the EAM section also varies to a certain extent due to manufacturing variations of the electroabsorption layer (or EAM absorption layer). These variations in the lasing wavelength of the LD section and in the photoluminescent wavelength of the EAM section may be such that the $\Delta\lambda$ of the optical modulator varies beyond tolerance limits.

SUMMARY OF THE INVENTION

The present invention has been made to solve the above problems. It is, therefore, an object of the present invention to provide an optical modulator and a method of manufacturing an optical modulator, capable of allowing the lasing wavelength of the laser diode section and the photoluminescent wavelength of the electroabsorption modulator section to be accurately adjusted so that the difference between the lasing wavelength and the photoluminescent wavelength is close to the design value.

According to one aspect of the present invention, a method of manufacturing an optical modulator having a laser diode section and an electroabsorption modulator section includes: a step of providing an LD growth layer on a semiconductor substrate, a step of providing an electroabsorption layer on the semiconductor substrate, a measuring step, and a stripe forming step. The LD growth layer is a semiconductor layer for manufacturing the laser diode section. The electroabsorption layer is for forming the electroabsorption modulator section. The measuring step measures a photoluminescent wavelength of the electroabsorption layer. A stripe forming step etches the LD growth layer so as to form a stripe structure section. Wherein the width of the stripe structure section is determined such that the difference between the lasing wavelength of the laser diode and the photoluminescent wavelength is close to a design value.

According to another aspect of the present invention, an optical modulator includes: a semiconductor substrate, a laser diode section, and a stripe structure section. The laser diode section is provided on the semiconductor substrate. The electroabsorption modulator section is provided on the semiconductor substrate at a position on the laser beam emission side of the laser diode section and adapted to control the emission state of the laser beam by application of an electric field. The stripe structure section extends through both the laser diode section and the electroabsorption modulator section. Wherein, the stripe structure section has a first portion located in the laser diode section and having a first width, and a second portion located in the electroabsorption modulator section and having a second width different from the first width.

Other and further objects, features and advantages of the invention will appear more fully from the following description.

DETAILED DESCRIPTION OF THE PREFERRED EMBODIMENTS

First Embodiment

Configuration of Device of First Embodiment

Figure 1:
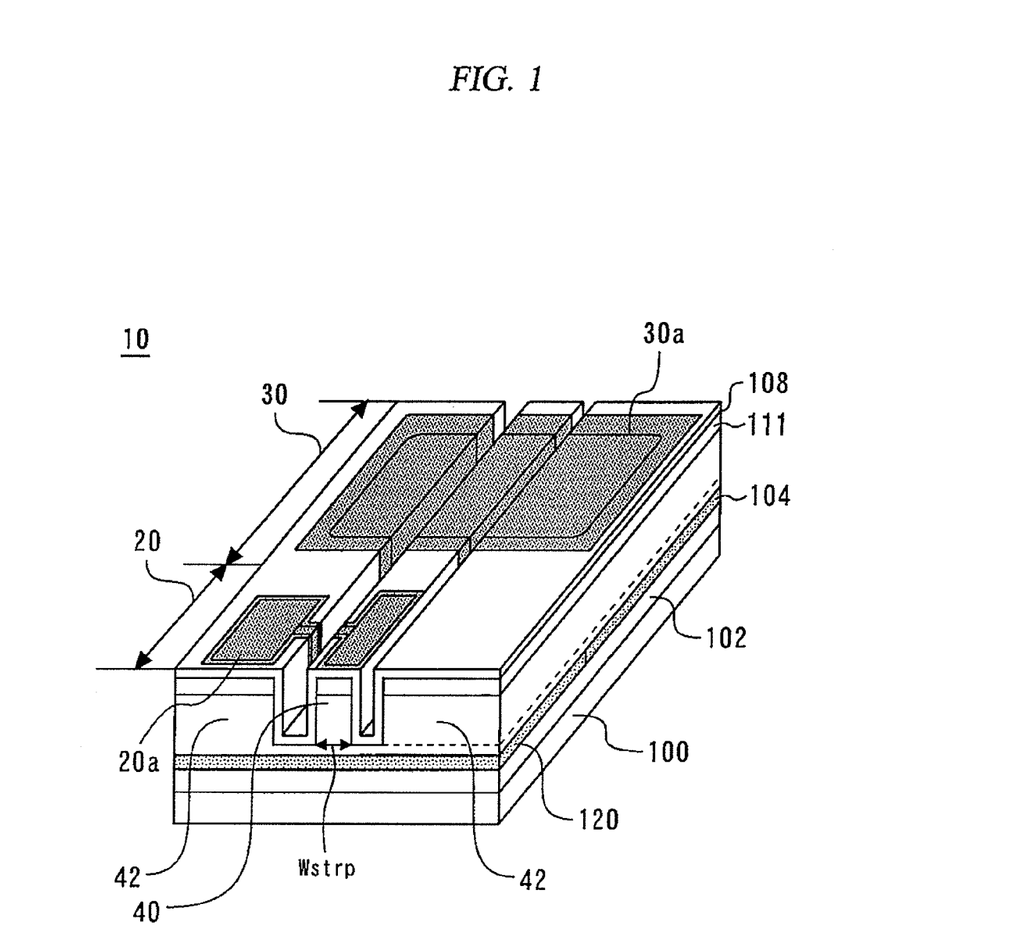
FIG. 1 is a perspective view schematically showing the configuration of an optical modulator in accordance with a first embodiment of the present invention.

FIG. 1 is a perspective view schematically showing the configuration of an optical modulator in accordance with a first embodiment of the present invention. An LD section 30 and an EAM section 20 are provided on a semiconductor substrate 100. As described above, the term "LD," as used herein, means "laser diode," and the term "EAM" means "electroabsorption modulator."

The optical modulator 10 shown in FIG. 1 includes the semiconductor substrate 100, which is made of n-type semiconductor. The semiconductor substrate 100 has stacked thereon an n-type cladding layer 102, an EAM absorption layer 120, an active layer 104, a laminated structure (on the p-type cladding layer side of the optical modulator 10), a p-type contact layer 111, and an insulating film 108, etc. It should be noted that the details of the laminated structure on the p-type cladding layer side of the optical modulator 10 will be described with reference to the cross-sectional views of FIGS. 2 and 3. The optical modulator 10 has on its top surface an EAM section electrode 20a and an LD section electrode 30a which are p-type electrodes. An n-type electrode is provided on the bottom surface side (not shown in FIG. 1) of the optical modulator 10. A voltage is applied between the n-type electrode and the p-type electrodes so as to effect lasing in the LD section (30) and effect an optical modulation in the EAM section (20) using optical absorption control.

The LD section 30 is a laminated structure constituting a part of the optical modulator 10 and including the entire active layer 104. The EAM section 20 is a laminated structure constituting another part of the optical modulator 10 and including the entire EAM absorption layer 120.

The optical modulator 10 has a ridge stripe structure section 40. As shown in FIG. 1, the ridge stripe structure section 40 is a protrusion extending laterally through both the EAM section 20 and the LD section 30. The width of the ridge stripe structure section 40 is denoted herein by $w_{strp}$. It should be noted that in the optical modulator 10, a terrace portion 42, which is a protrusion, is provided on each side of the ridge stripe structure section 40 and spaced a predetermined distance from the ridge stripe structure section 40.

Figure 2:
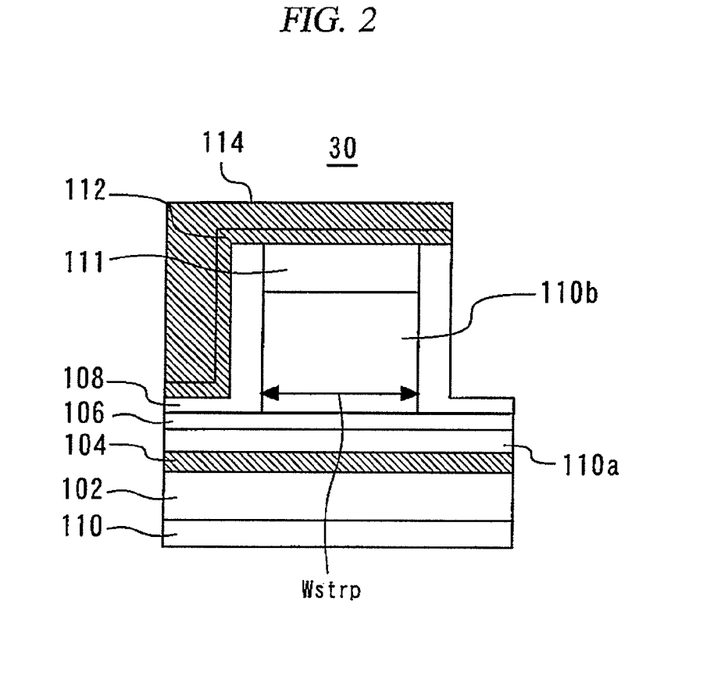
FIG. 2 is a cross-sectional view showing the ridge portion and the surrounding components of the LD section of the optical modulator of the first embodiment.

FIG. 2 is a cross-sectional view showing the ridge portion and the surrounding components of the LD section 30 of the optical modulator of the first embodiment. As shown in FIG. 2, the semiconductor substrate 100 in the LD section 30 has sequentially stacked thereon the n-type cladding layer 102, the active layer 104, a p-type cladding layer 110a, a diffraction grating layer 106, a p-type cladding layer 110b, the insulating film 108, the p-type contact layer 111, a p-type electrode 112, and an Au-plated electrode layer 114. As shown in this cross-sectional view, the LD section 30 is a distributed feedback semiconductor laser having the diffraction grating layer 106.

Figure 3:
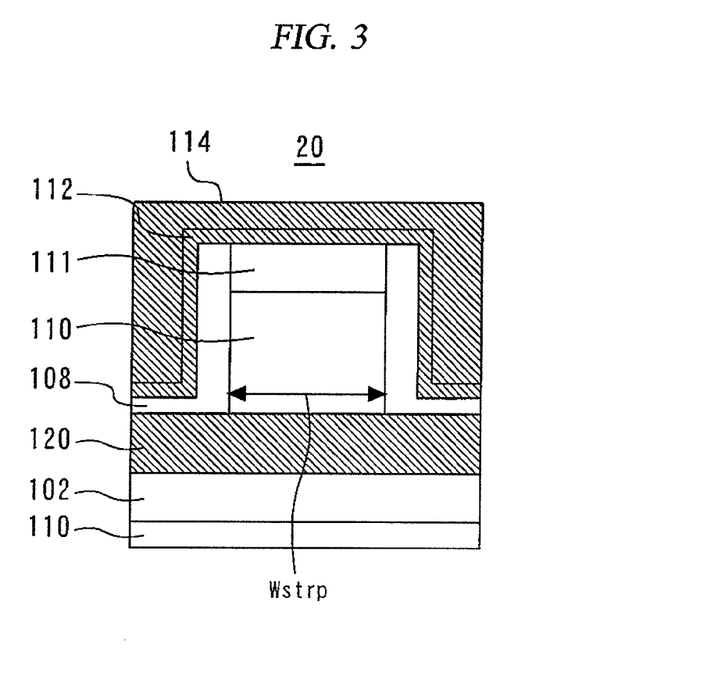
FIG. 3 is a cross-sectional view showing the ridge portion and the surrounding components of the EAM section of the optical modulator of the first embodiment.

Further, FIG. 3 is a cross-sectional view showing the ridge portion and the surrounding components of the EAM section 20 of the optical modulator of the first embodiment. As shown in FIG. 3, the semiconductor substrate 100 in the EAM section 20 has sequentially stacked thereon the n-type cladding layer 102, the EAM absorption layer 120, the p-type cladding layer 110b, the insulating film 108, the p-type contact layer 111, the p-type electrode 112, and the Au-plated electrode layer 114.

[Manufacturing Method of First Embodiment]

Figure 4:
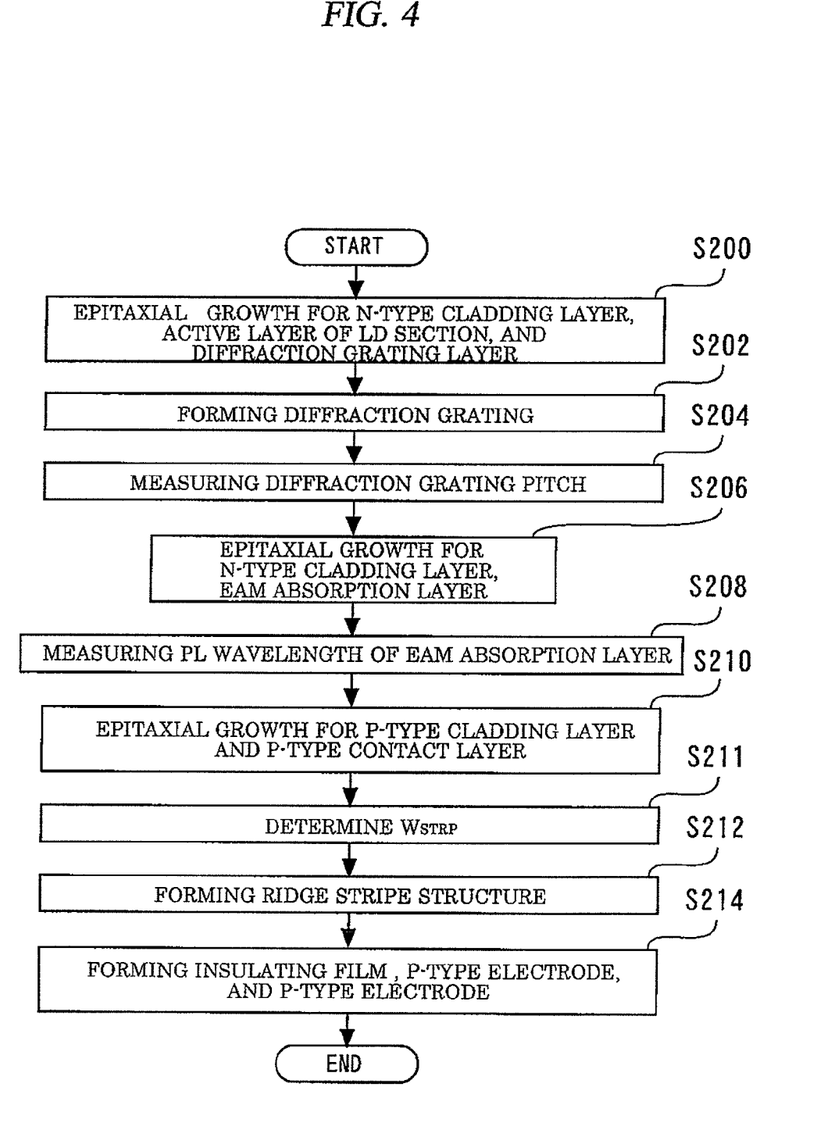
FIG. 4 is a flowchart showing a method of manufacturing an optical modulator in accordance with the first embodiment.

FIG. 4 is a flowchart showing a method of manufacturing an optical modulator in accordance with the first embodiment. FIGS. 5 to 9 are perspective views schematically showing the manufacturing process flow of the optical modulator of the first embodiment.

Generally, the absorption spectrum of the EAM section 20 may be managed by measuring the photoluminescent (PL) wavelength during the manufacture of the optical modulator. The lasing wavelength of the LD section 30, on the other hand, may be managed by measuring the pitch of the diffraction grating. The difference between the PL wavelength of the EAM section 20 and the lasing wavelength of the LD section 30 is referred to herein as Aλ.

(Step S200)

Referring to the flowchart of FIG. 4, first, the n-type cladding layer 102, and the active layer 104 and the diffraction grating layer 106 of the LD section 30, are sequentially formed on the semiconductor substrate 100 by epitaxial growth in Step S200. In this way, LD growth layers for manufacturing the LD section 30 are formed on the semiconductor substrate 100. That is, in the present embodiment, the LD growth layers are the n-type cladding layer 102 and the active layer 104 and the diffraction grating layer 106 of the LD section 30.

(Step S202)

Figure 5:
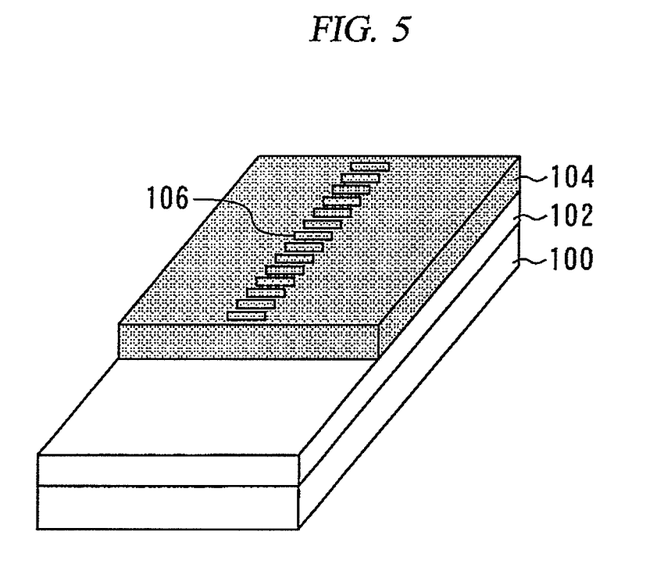
FIG. 5 is a perspective view schematically showing the manufacturing process flow of the optical modulator of the first embodiment.

Next, a diffracting grating is formed in the diffraction grating layer 106 in Step S202, thereby completing the structure shown in a perspective view in FIG. 5. More specifically, the diffraction grating layer 106 is configured as diffracting grating bars (or elements constituting a diffraction grating) embedded in the p-type cladding layer 110a, as shown in the cross-sectional view of FIG. 2.

(Step S204)

The pitch of the diffracting grating in the diffraction grating layer 106 is then measured in Step S204. That is, this step measures the distance between two corresponding points on adjacent grating bars of the diffraction grating structure. The diffraction grating pitch of the diffraction grating layer 106 is a factor in determining the lasing wavelength of the LD section 30.

(Step S206)

Figure 6:
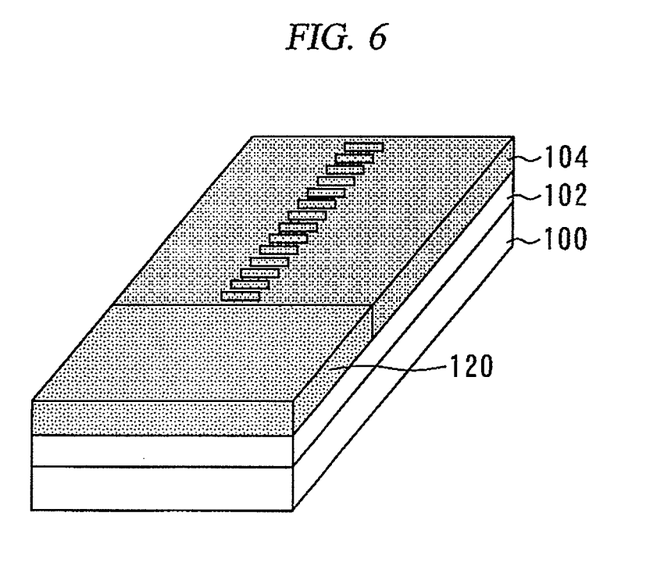
FIG. 6 is a perspective view schematically showing the manufacturing process flow of the optical modulator of the first embodiment.

The EAM absorption layer 120 is then formed on the n-type cladding layer 102 in Step S206, thereby completing the structure shown in a perspective view in FIG. 6.

(Step S208: Measuring Step)

The photoluminescent wavelength (or PL wavelength) of the EAM absorption layer 120 is then measured in Step S208. The details of this step are omitted, since the measurement of the PL wavelength may be accomplished by a known technique.

(Step S210)

Figure 7:
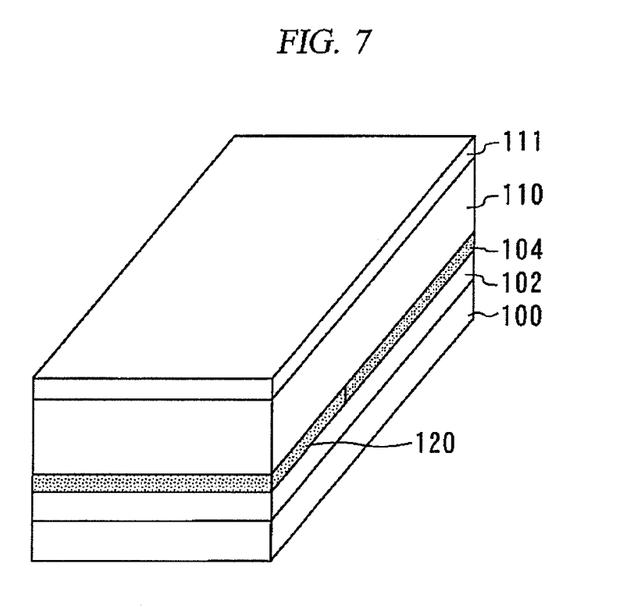
FIG. 7 is a perspective view schematically showing the manufacturing process flow of the optical modulator of the first embodiment.

The p-type cladding layer 110b and the p-type contact layer 111 are sequentially formed in Step S210, thereby completing the structure shown in a perspective view in FIG. 7.

(Steps S211 and S212: Stripe Forming Step)

The width of the ridge stripe structure section 40 is determined in Step S211 such that the difference Δλ between the lasing wavelength of the LD section 30 and the photoluminescent wavelength of the EAM section 20 is close to the design value. As shown in FIG. 1, the width of the ridge stripe structure section 40 is referred to herein as the ridge stripe width $w_{strp}$.

The lasing wavelength of the LD section 30 is dependent on the diffraction grating pitch of the diffraction grating layer 106 and the ridge stripe width $w_{strp}$. Therefore, the lasing wavelength of the LD section 30 may be controlled by adjusting the diffraction grating pitch and/or the ridge stripe width.

The PL wavelength of the EAM absorption layer 120 in the EAM section 20, on the other hand, can be typically controlled by changing the rate of flow of material gas during the epitaxial growth. Generally, the controllability of the PL wavelength of the EAM section 20 is lower than the controllability of the lasing wavelength of the LD section 30. Controllability of a wavelength refers to the ease with which the wavelength can be controlled to a given value and may be determined by the degree to which the wavelength can deviate from that value when it is controlled by a standard control process. For example, a wavelength controllability of ±0.5 nm means that the wavelength may vary over the range of 1554.5-1555.5 nm when it is controlled toward 1555.0 nm by a standard control process. That is, an optical modulator designed to have a PL wavelength of 1555.0 nm may have a PL wavelength of 1554.5-1555.5 nm when the controllability of the PL wavelength is ±0.5 nm in the manufacturing process. Specifically, the controllability of the PL wavelength of the EAM section is approximately ±5 nm whereas the controllability of the lasing wavelength of the LD section is approximately ±0.5 nm; that is, the wavelength controllability of the EAM section 20 is approximately ten times lower than that of the LD section 30.

If the manufacturing process is such that the EAM section 20 is integrated or formed after the LD section 30 is formed, then the PL wavelength controllability of the EAM section 20 (which is formed in the step following the LD section forming step) determines the controllability of $\Delta\lambda$. It should be noted that the PL wavelength controllability of the EAM section 20 is relatively low, e.g., ±5 nm. This means that, if $\Delta\lambda$ need be controlled to, e.g., a target value ±3 nm in order to ensure device performance stability, then the PL wavelength controllability of the EAM section 20 is not adequate. In other words, even if $\Delta\lambda$ is controlled toward a target value (plus a tolerance of ±3 nm) when the optical modulator is manufactured, the resultant value of $\Delta\lambda$ can be any value within the range of the target value ±5 nm due to manufacturing variations.

In order to avoid this, the present invention utilizes the fact that the lasing wavelength of the LD section 30 is dependent on the ridge stripe width, as well as the diffraction grating pitch. That is, after measuring the PL wavelength of the EAM section 20, the ridge stripe width is determined so as to compensate for the deviation of the measured PL wavelength value from the target value, and the ridge structure is manufactured with the determined ridge stripe width. Specifically, if the value of the photoluminescent wavelength as measured in the measuring step is longer than a target photoluminescent wavelength, then a first width-determination is made to determine the width of the ridge stripe structure section 40 such that the lasing wavelength of the laser diode increases with increasing difference between the measured photoluminescent wavelength value and the target photoluminescent wavelength. If the value of the photoluminescent wavelength as measured in the measuring step is shorter than the target photoluminescent wavelength, on the other hand, then a second width-determination is made to determine the width of the ridge stripe structure section 40 such that the lasing wavelength of the laser diode decreases with increasing difference between the measured photoluminescent wavelength value and the target photoluminescent wavelength.

The following description assumes that the lasing wavelength of the LD section 30 has a ridge stripe width dependence of approximately 3 nm/μm. This means that a 1 μm increase in the ridge stripe width results in a 3 nm increase in the lasing wavelength of the LD section 30 (that is, the lasing wavelength shifts towards the longer wavelengths). Further, a 1 μm decrease in the ridge stripe width results in a 3 nm decrease in the lasing wavelength of the LD section 30 (that is, the lasing wavelength shifts towards the shorter wavelengths). This dependence (or rate of change) value is by way of example; the ridge stripe width dependence of the lasing wavelength of the LD section 30 is dependent on the structure of the optical modulator. The ridge stripe width dependence of the lasing wavelength of the LD section 30 may be determined in advance, making it possible to adjust the difference $\Delta\lambda$ between the lasing wavelength and the photoluminescent wavelength to be close to the desired value even if the PL wavelength of the EAM section 20 deviates from the target value.

For example, let it be assumed that the PL wavelength of the EAM section 20 has increased from its design value $\lambda_1$ by 4 nm (that is, the PL wavelength is $\lambda_1$+4 nm). In this case, the ridge stripe is formed in such a manner that its width $w_{strp}$ is $w_o$+0.4 μm, where $w_o$ is the initial design value of the ridge stripe width $w_{strp}$. The resultant value of $\Delta\lambda$ is its target value +2.8 nm, thus ensuring device performance.

A specific calculation example is given below. In the following description, the symbol $\lambda_1$ denotes the design value of the PL wavelength of the EAM section (in this example, the design value is 1500.0 nm). In optical communication devices, the PL wavelength is typically set to be within the range of approximately 1300-1600 nm.

the design value $\lambda_1$ of the PL wavelength: $\lambda 1$=1500.0 nm the initial design value $w_O$ of the ridge stripe width: $w_O$=2.0 μm the design value $\lambda_{LDO}$ of the LD lasing wavelength when the ridge stripe width is 2.0 μm: $\lambda_{LDO}$=1555 0 nm In this case, the initial design value (or target value) of the difference $\Delta\lambda$ of the photoluminescent wavelength from the lasing wavelength (i.e., $\lambda_1$-$\lambda_{LDO}$) is −55.0 nm.

The optical modulator 10 exhibits the desired device performance when $\Delta\lambda$ is between −58.0 nm and −52.0 nm, inclusive.

The manufacturing process shown in FIG. 4 is initiated with these settings. The process then proceeds from Step S200 through Steps S202, S204, and S206 to Step S208 at which the PL wavelength of the EAM section 20 is measured. Now let it be assumed that the PL wavelength is measured to be 1504.0 nm. If a ridge having a width of 2.0 μm is manufactured in this state, the result is that $\Delta\lambda$=1504.0 nm-1555.0 nm=−51.0 nm, which is out of the required $\Delta\lambda$ range (from −58.0 to −52.0 nm) for ensuring the desired device performance.

In order to prevent this from happening, in accordance with the present embodiment the ridge stripe width $w_{strp}$ is increased from 2.0 μm to 2.4 μm (that is, $w_o$+0.4 μm=$w_{strp}$).

This increases the LD lasing wavelength by the following amount:

0.4 μm×(3.0 nm/μm)=1.2 nm

That is, the LD lasing wavelength is:

1555.0 nm+1.2 nm=1556.2 nm

The difference $\Delta\lambda$ of the photoluminescent wavelength from the lasing wavelength is as follows:

$\Delta\lambda$=1504.0 nm−1556.2 nm=−52.2 nm

Thus, the difference $\Delta\lambda$ is within the required $\Delta\lambda$ range for ensuring the necessary device performance. That is, the obtained $\Delta\lambda$ value (−52.2 nm) minus the initial $\Delta\lambda$ design value (−55.0 nm) equals +2.8 nm. Therefore, the obtained $\Delta\lambda$ value satisfies a tolerance of the target value (−55.0 nm)±3 nm.

It should be noted that the above calculation formulas are based on the relationship between the ridge stripe width and the PL wavelength. However, the pitch of the diffraction grating may be used as a parameter in calculation formulas, since, as described above, the pitch of the diffraction grating of the diffraction grating layer 106 is a factor in determining the lasing wavelength of the LD section 30. That is, the value of the LD lasing wavelength in the manufacturing process may be determined or estimated based on the diffraction gating pitch, as measured during the manufacturing process, and the design value of the ridge stripe pitch $w_o$. The width of the ridge stripe structure section 40 may be determined based on this estimated value of the LD lasing wavelength and the measured photoluminescent wavelength value such that $\Delta\lambda$ is close to its target value.

Figure 8:
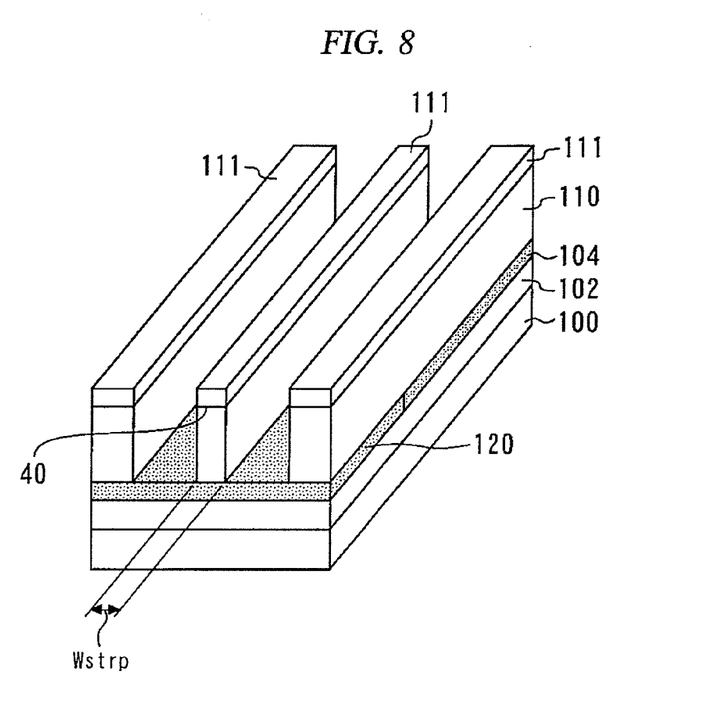
FIG. 8 is a perspective view schematically showing the manufacturing process flow of the optical modulator of the first embodiment.

Next, etching is performed in Step S212 to manufacture the ridge stripe structure section 40 serving as an optical waveguide, thereby completing the structure shown in a perspective view in FIG. 8. Specifically, an elongated stripe waveguide is formed by etching using a photomask configured based on the above design value of the ridge stripe width $w_{strp}$ (i.e., 2.4 μm).

(Step S214)

Figure 9:
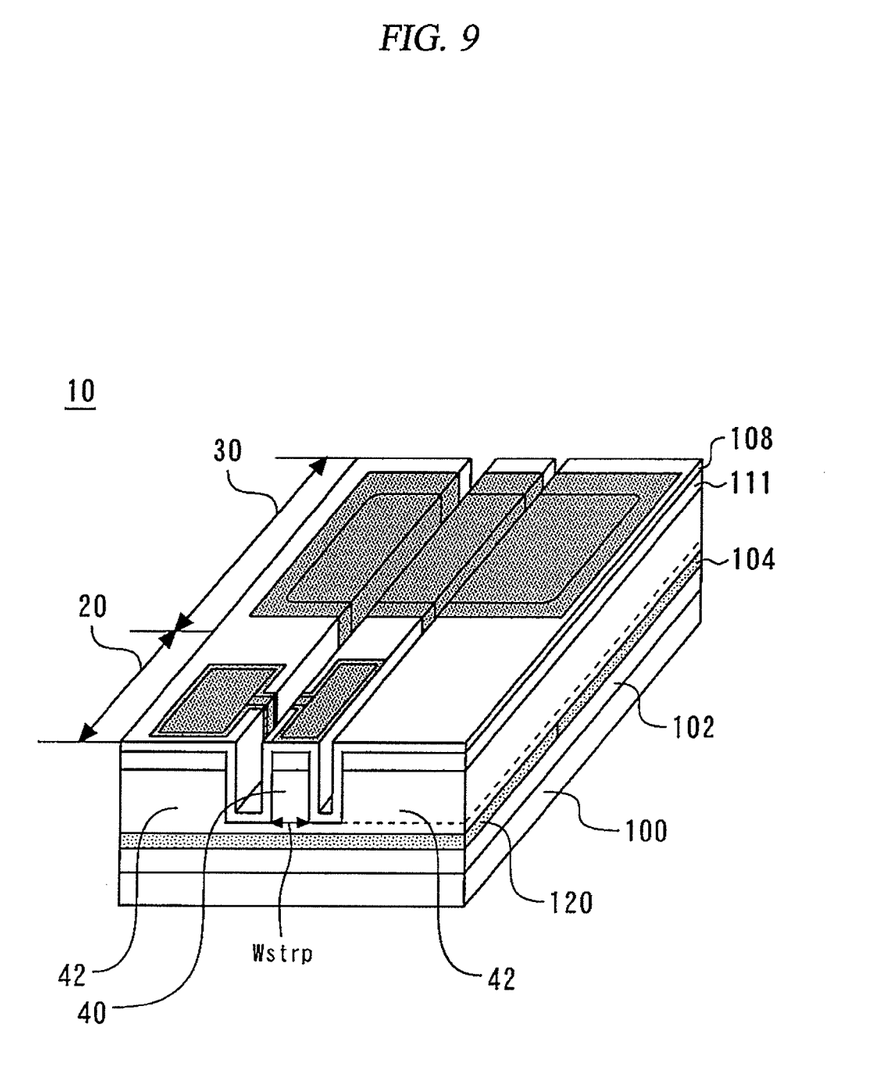
FIG. 9 is a perspective view schematically showing the manufacturing process flow of the optical modulator of the first embodiment.

Further, the insulating film 108, the p-type electrode 112, and the Au-plated electrode layer 114 are formed on top of one another, thereby completing the optical modulator 10 shown in FIG. 9.

As described above, in accordance with the present embodiment, the photoluminescent wavelength of the EAM absorption layer 120 is measured, and if the measured value deviates from the target value, then the design value of the width of the ridge stripe structure section 40 may be modified. In this way, the deviation in the photoluminescent wavelength of the EAM absorption layer 120 can be compensated for, since the lasing wavelength of the LD section 30 is dependent on the width of the ridge stripe structure section 40.

The accuracy of the lasing wavelength adjustment effected by adjusting the width of the ridge stripe structure section 40 is higher than the accuracy of adjustment of the photoluminescent wavelength of the EAM absorption layer 120. Therefore, in the present embodiment, the difference $\Delta\lambda$ of the photoluminescent wavelength of the EAM section 20 from the lasing wavelength of the LD section 30 may be accurately adjusted to be close to its target value.

In accordance with the present embodiment, the design value of the width of the ridge stripe structure section 40 may be modified by utilizing the fact that the lasing wavelength of the LD section 30 is dependent on the diffraction grating pitch and the width of the stripe structure.

It should be noted that, in the manufacturing process of the present embodiment shown in the flowchart of FIG. 4, the LD section 30 is formed before the EAM section 20 is integrated or formed. The reason for this is so that the active layer 104, through which a current flows, can be epitaxially grown on the flat semiconductor substrate before other manufacturing processes are performed on the substrate, thereby ensuring long term reliability of the optical modulator.

The present embodiment provides a method of manufacturing an optical modulator, wherein the difference $\Delta\lambda$ between the photoluminescent wavelength of the EAM section 20 and the lasing wavelength of the LD section 30 can be accurately controlled without significantly changing the manufacturing process in which the LD section 30 is formed before the EAM section 20 is integrated or formed.

[Variation of First Embodiment]

Figure 10:
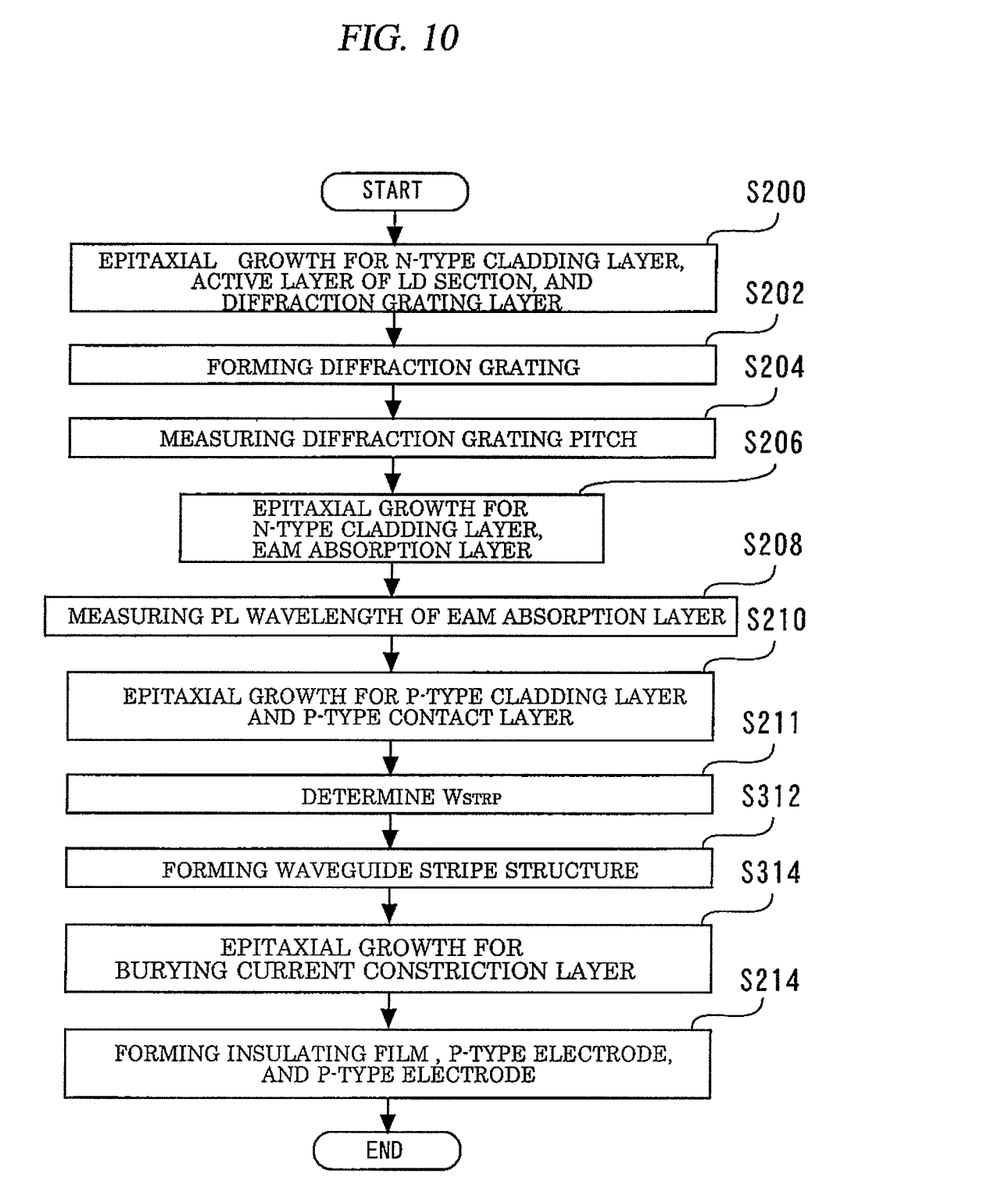
FIG. 10 is a flowchart showing a method of manufacturing an optical modulator having a buried stripe structure.

FIG. 10 is a flowchart showing a method of manufacturing an optical modulator having a buried stripe structure. This manufacturing method is a variation of the above-described manufacturing method of the first embodiment. Although the first embodiment has been described in connection with the optical modulator 10 having a ridge stripe structure section (or ridge waveguide structure), it is to be understood that the advantages of the first embodiment described above can also be obtained with an optical modulator having a buried stripe structure.

The manufacturing method shown in FIG. 10 differs that shown in FIG. 4 in that Step S212 is replaced by Step S312 (for forming a waveguide stripe structure), and Step S314 (for epitaxial growth for burying the current constriction layer) is performed after Step S312.

It should be noted that although an optical modulator having a buried stripe structure (such as that described above in connection with FIG. 10) can be configured so that the lasing wavelength can be controlled by adjusting the width of the stripe, it is to be understood that the first embodiment is preferably applied to optical modulators having a ridge stripe structure section (or ridge waveguide structure), which is not buried. The reason for this is that the burying process is an epitaxial growth process and hence is a high temperature process (typically, at 600° C. or more), meaning that the burying process may serve to alter the absorption wavelength of the EAM section 20 since the EAM section 20 experiences high temperatures in the burying process. This may result in a deviation in the difference $\Delta\lambda$ between the photoluminescent wavelength of the EAM section and the lasing wavelength of the LD section from the target value after Al is adjusted in a previous step. In the case of optical modulators having a ridge stripe structure section such as the ridge stripe structure section 40, on the other hand, the width of the ridge stripe can be more accurately controlled, since no epitaxial growth process is performed after forming the stripe.

Second Embodiment

Figure 11:
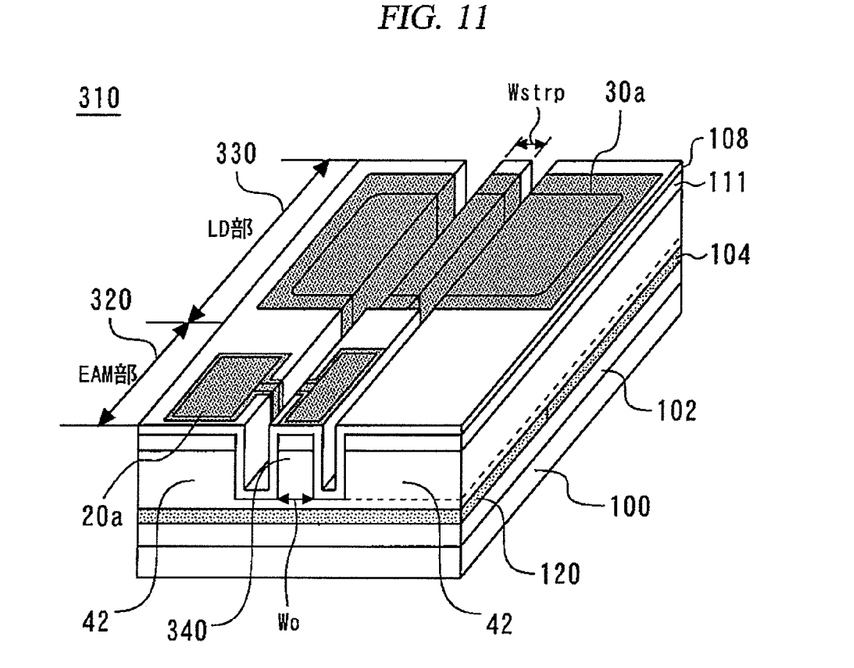
FIG. 11 is a perspective view schematically showing the configuration of an optical modulator in accordance with a second embodiment of the present invention.

FIG. 11 is a perspective view schematically showing the configuration of an optical modulator 310 in accordance with a second embodiment of the present invention. The configurations of the EAM section 320 and the LD section 330 of this optical modulator 310 differ from those of the EAM section 20 and the LD section 30 of the optical modulator 10 of the first embodiment shown in FIG. 1. Specifically, in the present embodiment, the portion of a ridge stripe structure section 340 located in the LD section 330 has a different width than the portion of the ridge stripe structure section 340 located in the EAM section 320.

Thus, in the second embodiment, the EAM section 320 and the LD section 330 have different stripe widths, as shown in FIG. 11. The lasing wavelength of the LD section 330 is controlled only by adjusting the stripe width of the LD section 330 without adjusting the stripe width of the EAM section 320. A change in the width of the stripe of the LD section 330 results in a change in the lasing wavelength of the LD section 330, as described in connection with the first embodiment. However, a change in the width of the stripe of the EAM section 320 results in a change in the extinction characteristics and the frequency characteristics of the EAM section 320. If the stripe of the LD section 330 and that of the EAM section 320 are integrated together into a single elongated stripe with a uniform width (as in the optical modulator 10 of the first embodiment) and the lasing wavelength of the LD section 330 is adjusted to the desired range by adjusting the width of this elongated stripe (as in the first embodiment), an unwanted change in the characteristics of the EAM section 320 may result. In the second embodiment, since $\Delta\lambda$ is adjusted only by changing the width of the stripe of the LD section 330, this adjustment does not affect the performance of the EAM section 320.

Figure 12:
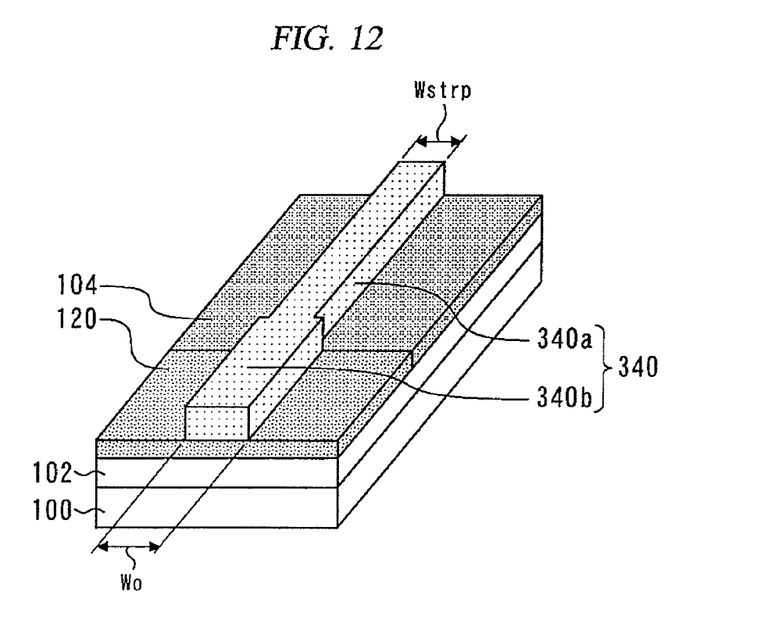
FIG. 12 is a perspective view showing the manufacturing process flow of the optical modulator of the second embodiment.

FIG. 12 is a perspective view showing the manufacturing process flow of the optical modulator 310 of the second embodiment. Specifically, the manufacturing process step shown in FIG. 12 corresponds to that shown in FIG. 8 and described in connection with the first embodiment.

The manufacturing method of the second embodiment differs from that of the first embodiment in that Step S211 for determining the stripe width $w_{strp}$ (see the flowchart shown in FIG. 4) is replaced by the following step.

In the optical modulator of the first embodiment, the ridge stripe structure section 40 has a uniform width $w_{strp}$ and extends through both the EAM section 20 and the LD section 30. In the case of the optical modulator 310 of the second embodiment, on the other hand, in the step corresponding to Step S211 shown in FIG. 4, the initial design value $w_o$ of the ridge stripe width of the EAM section 320 is set to be 2.0 μm, whereas the ridge stripe width of the LD section 330 is increased from 2.0 μm to 2.4 μm (that is, $w_o$+0.4 μm=$w_{strp}$), as in the first embodiment.

After this step, an elongated stripe waveguide is formed by etching using a photomask, as in Step S212.

Since the ridge stripe structure section 340 extends through and is shared by the LD section 330 and the EAM section 320, the width of this ridge stripe structure section 340 affects the extinction characteristics and the frequency characteristics of the EAM section 320, as well as the lasing wavelength of the LD section 330. In the present embodiment, however, the portion (or first portion) of the ridge stripe structure section 340 located in the LD section 330 has a different width than the portion (or second portion) of the ridge stripe structure section 340 located in the EAM section 320, so that the LD section 330 and the EAM section 320 can be optimally designed to exhibit the desired characteristics.

Obviously many modifications and variations of the present invention are possible in the light of the above teachings. It is therefore to be understood that within the scope of the appended claims the invention may by practiced otherwise than as specifically described.

The entire disclosure of Japanese Patent Application No. 2012-208417, filed on Sep. 21, 2012, including specification, claims, drawings, and summary, on which the Convention priority of the present application is based, is incorporated herein by reference in its entirety.

The advantageous effect of the present invention may be summarized as follows: the present invention provides an optical modulator and a method of manufacturing an optical modulator, capable of allowing the lasing wavelength of the laser section and the photoluminescent wavelength of the electroabsorption modulator section to be accurately adjusted so that the difference between the lasing wavelength and the photoluminescent wavelength is close to the design value.

What is claimed is:

1. A method of manufacturing an optical modulator having a laser diode section generating light at a lasing wavelength and an electroabsorption modulator section for modulating the light generated by the laser diode section, comprising:
   forming a laser diode (LD) growth layer on a semiconductor substrate, the LD growth layer being a semiconductor layer for manufacturing the laser diode section;
   forming an electroabsorption layer on the semiconductor substrate, the electroabsorption layer being for forming the electroabsorption modulator section;
   measuring photoluminescent wavelength of the electroabsorption layer and comparing the photoluminscent wavelength measured to a design photoluminscent wavelength;
   if the photoluminscent wavelength measured is different from the design photoluminscent wavelength, calculating an adjusted width of a stripe structure of the optical modulator, as compared to a design width of the stripe structure of the optical modulator so that a difference between (i) a design lasing wavelength of the light generated by the laser diode section and the photoluminscent wavelength measured, becomes smaller with respect to a design value, wherein the design value is a difference between (ii) a design photoluminscent wavelength of the electroabsorption modulator section and the design lasing wavelength of the laser diode section; and
   etching at least the LD growth layer to form a stripe structure in at least the laser diode section having a width equal to the adjusted width.

2. The method according to claim 1, wherein:
   if the photoluminescent wavelength measured; is longer than the target photoluminescent wavelength, making the adjusted width larger than the design width; and
   if the photoluminescent wavelength measured is shorter than the target photoluminescent wavelength, making the adjusted width smaller than the design width.

3. The method according to claim 1, including etching the LD growth layer that is located in the laser diode section and the electroabsorption layer that is located in the electroabsorption modulator section so that the stripe structure has different widths in the laser diode section and in the electroabsorption modulator section.

4. The method according to claim 1, wherein:
   forming the LD growth layer includes
      forming an active layer on the semiconductor substrate, and
      forming a diffraction grating structure on the active layer at a position where the stripe structure is to be formed, the diffraction grating structure including a plurality of grating bars;
   before forming the stripe structure, measuring diffraction grating pitch of the diffraction grating structure, the diffraction grating pitch being the pitch of the plurality of grating bars of the diffraction grating structure; and
   determining the adjusted width of the stripe structure, based on the diffraction grating pitch and the photoluminescent wavelength measured, such that the difference between the photoluminscent wavelength measured and the design lasing wavelength of the light generated by the laser diode is closer to the design value.

5. The method according to claim 2, including etching the LD growth layer that is located in the laser diode section and the electroabsorption layer that is located in the electroabsorption modulator section so that the stripe structure has different widths in the laser diode section and in the electroabsorption modulator section.

6. The method according to claim 2, wherein:
   forming the LD growth layer includes
      forming an active layer on the semiconductor substrate, and
      forming a diffraction grating structure on the active layer at a position where the stripe structure is to be formed, the diffraction grating structure including a plurality of grating bars;
   before forming the stripe structure, measuring diffraction grating pitch of the diffraction grating structure, the diffraction grating pitch being the pitch of the plurality of grating bars of the diffraction grating structure; and determining the adjusted width of the stripe structure, based on the diffraction grating pitch and the photoluminescent wavelength measured, such that the difference between the photoluminscent wavelength measured and the design lasing wavelength of the light generated by the laser diode is closer to the design value.

7. The method according to claim 3, wherein:

forming the LD growth layer includes
- forming an active layer on the semiconductor substrate, and
- forming a diffraction grating structure on the active layer at a position where the stripe structure is to be formed, the diffraction grating structure including a plurality of grating bars;

before forming the stripe structure, measuring diffraction grating pitch of the diffraction grating structure, the diffraction grating pitch being the pitch of the plurality of grating bars of the diffraction grating structure; and determining the adjusted width of the stripe structure, based on the diffraction grating pitch and the photoluminescent wavelength measured, such that the difference between the photoluminscent wavelength measured and the design lasing wavelength of the light generated by the laser diode is closer to the design value.

8. The method according to claim 1, including etching the LD growth layer that is located in the laser diode section and the electroabsorption layer that is located in the electroabsorption modulator section so that the stripe structure has the same width in the laser diode section and in the electroabsorption modulator section.

* * * * *